(12) United States Patent
Gao et al.

(10) Patent No.: US 10,674,635 B2
(45) Date of Patent: Jun. 2, 2020

(54) FAN-LESS CHILLER-LESS LIQUID-AIR COOLING FOR ELECTRONIC RACKS OF IT COMPONENTS IN DATA CENTERS

(71) Applicants: Baidu USA LLC, Sunnyvale, CA (US); Baidu.com Times Technology (Beijing) Co., Ltd., Beijing (CN)

(72) Inventors: Tianyi Gao, Santa Clara, CA (US); Yan Cui, San Jose, CA (US); Xiaogang Sun, Beijing (CN); Ali Heydari, Albany, CA (US)

(73) Assignees: Baidu USA LLC, Sunnyvale, CA (US); Baidu.com Times Technology (Beijing) Co., Ltd., Beijing (CN)

( * ) Notice: Subject to any disclaimer, the term of this patent is extended or adjusted under 35 U.S.C. 154(b) by 305 days.

(21) Appl. No.: 15/526,313

(22) PCT Filed: May 5, 2017

(86) PCT No.: PCT/CN2017/083152
§ 371 (c)(1),
(2) Date: May 11, 2017

(87) PCT Pub. No.: WO2018/201425
PCT Pub. Date: Nov. 8, 2018

(65) Prior Publication Data
US 2018/0324976 A1   Nov. 8, 2018

(51) Int. Cl.
*H05K 7/20* (2006.01)

(52) U.S. Cl.
CPC ..... *H05K 7/20772* (2013.01); *H05K 7/20745* (2013.01); *H05K 7/20836* (2013.01)

(58) Field of Classification Search
CPC .......................................................... G06F 1/20
See application file for complete search history.

(56) References Cited

U.S. PATENT DOCUMENTS

| | | | |
|---|---|---|---|
| 8,184,436 B2 * | 5/2012 | Campbell | H05K 7/203 361/700 |
| 8,804,334 B2 * | 8/2014 | Eckberg | H05K 7/2079 361/696 |
| 8,984,906 B2 * | 3/2015 | Tozer | H05K 7/20745 361/688 |

(Continued)

*Primary Examiner* — Zachary Pape
(74) *Attorney, Agent, or Firm* — Womble Bond Dickinson (US) LLP

(57) ABSTRACT

A data center cooling system includes a housing to contain electronic racks of IT components operating therein, a coolant distribution unit (CDU) situated within the housing to control a liquid flow of a cooling liquid. One or more liquid cooling devices are disposed on the IT components to receive a first liquid from the CDU, to exchange or extract heat generated from the IT components, to transform the first liquid to a second liquid with a higher temperature, and to transmit the second liquid back to the CDU. The CDU is coupled to a heat transfer system to dissipate the exchanged heat to an external environment. The data center cooling system includes an airflow delivery system to generate a direct or indirect airflow to travel through the servers of the electronic racks to remove heat generated by the servers to the external environment eliminating chiller and IT fans.

8 Claims, 8 Drawing Sheets

(56) References Cited

U.S. PATENT DOCUMENTS

| | | | |
|---|---|---|---|
| 9,007,221 B2* | 4/2015 | Zeighami | H05K 7/20781 |
| | | | 340/605 |
| 9,110,476 B2* | 8/2015 | David | G05D 23/00 |
| 9,445,531 B1* | 9/2016 | Heydari | H05K 7/20827 |
| 2012/0026691 A1* | 2/2012 | Campbell | H05K 7/20781 |
| | | | 361/700 |
| 2015/0237767 A1* | 8/2015 | Shedd | H05K 7/20254 |
| | | | 165/104.31 |
| 2015/0237768 A1* | 8/2015 | Endo | H05K 7/20736 |
| | | | 361/679.49 |

* cited by examiner

FAN-LESS CHILLER-LESS LIQUID-AIR COOLING FOR ELECTRONIC RACKS OF IT COMPONENTS IN DATA CENTERS

CROSS-REFERENCE TO RELATED APPLICATION

This patent application is a U.S. National Phase Application under 35 U.S.C. § 371 of International Application No. PCT/CN2017/083152, filed May 5, 2017, entitled "FAN-LESS CHILLER-LESS LIQUID-AIR COOLING FOR ELECTRONIC RACKS OF IT COMPONENTS IN DATA CENTERS," which is incorporated by reference herein by its entirety.

FIELD OF THE INVENTION

Embodiments of the present invention relate generally to data centers. More particularly, embodiments of the invention relate to fan-less chiller-less liquid-air cooling for electronic racks in data centers.

BACKGROUND

Heat removal is a prominent factor in computer system and data center design. The number of high performance electronics component such as high performance CPU and GPU packaged inside servers has steadily increased, thereby increasing the amount of heat generated and dissipated during the ordinary operation of the servers. The reliability of servers used within a data center decreases if the environment in which they operate is permitted to increase in temperature over time. Maintaining a proper thermal environment is critical for normal operating of these servers in data centers. It requires more efficient heat removal solutions especially in the cases of cooling these high performance servers. A significant portion of the data center's electric power is used for the cooling systems. As the number of high density servers within a data center increases, a greater portion of the power is commensurately consumed by the data center to cool electronic components within the servers. Therefore, it becomes more critical to design the cooling systems for the electronic rack and the data center, which can handle the constantly increasing heat density, and at the same time, improve energy efficiency.

In conventional data center structures, a computer room air conditioner (CRAC) or a computer room air handler (CRAH) circulates room recirculated air throughout a data center room. Conventionally, the CRAC/CRAH cools returning air and supplies the cooled air to the data center room and to the servers by blower fans. The CRAC/CRAH units extract the heat from the air and transfer it to a chiller plant, cooling tower, or external atmosphere. Both the IT fans and CRAC/CRAH blowers are used for moving the airflow pathing through the IT equipment and the CRAC/CRAH unit. A large portion of cooling energy is required for running server fans, CRAC/CRAH blowers and chillers. Eliminating chiller and these air moving devices can achieve a significant portion of cooling energy saving.

SUMMARY

Embodiments of the present disclosure provide a data center system.

In an aspect of the disclosure, the data center system comprises: a housing to house a plurality of electronic racks of information technology (IT) components operating therein; a coolant distribution unit (CDU) situated within the housing to control a liquid flow of a cooling liquid; one or more cooling devices disposed on the IT components to receive a first liquid from the CDU, to exchange heat generated from the IT components using the first liquid, to transform the first liquid into a second liquid with a higher temperature, and to transmit the second liquid carrying the exchanged heat back to the CDU to form a first liquid loop, wherein the one or more CDUs couples the first liquid loop to a heat dissipating system to carry the exchanged heat to the external environment outside of the housing without a chiller unit; and an airflow delivery system to generate an airflow from a cooler/colder external environment, to cause the airflow to travel through the servers of the electronic racks to exchange heat generated by the servers due to operations of the servers, and to exhaust the airflow carrying the exchanged heat back to the external environment outside of the housing.

In another aspect of the disclosure, the data center system comprises: a housing to house a plurality of electronic racks of information technology (IT) components operating therein; a coolant distribution unit (CDU) situated within the housing to control a liquid flow of a cooling liquid; one or more cooling devices disposed on the IT components to receive a first liquid from the CDU, to exchange heat generated from the IT components using the first liquid, to transform the first liquid into a second liquid with a higher temperature, and to transmit the second liquid carrying the exchanged heat back to the CDU to form a first liquid loop, wherein the one or more CDUs couples the first liquid loop to a heat dissipating system to carry the exchanged heat to the external environment outside of the housing without a chiller unit; and an airflow delivery system to generate a closed-loop airflow from non-contaminated air to cause the airflow to travel through the servers of the electronic racks to exchange heat generated by the servers due to operations of the servers, and to remove the exchanged heat to the external environment outside of the housing by an air-to-air heat exchanger.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, a fan-less and chiller-less data center includes a cooling system combining liquid-to-liquid heat exchangers and air-to-air heat exchanges. The data center includes a housing or room to house a plurality of electronic racks of information technology (IT) components operating therein. The data center includes one or multiple coolant distribution unit(s) (CDUs) situated within the room to control a liquid flow supply of a cooling liquid. The cooling liquid flows from the CDU to one or more cooling devices disposed on the IT components to receive to exchange heat generated from the IT components and back to the CDU to form a closed liquid loop. The liquid loop is thermally coupled to a heat dissipating system that carries the exchanged heat to external environment outside of the housing without a chiller unit. In one embodiment, the air to air heat exchanger of the data center includes an air flow delivery system to generate an airflow from a cooler/colder external environment through the servers of the electronic racks to exchange heat generated by the servers due to operations of the servers, and to exhaust the airflow carrying the exchanged heat to the external environment, outside of the housing.

In one embodiment, the air to air heat exchanger of the data center includes an air flow delivery system to generate an airflow (e.g., a closed-loop airflow) to travel through airspaces of the servers of the electronic racks to exchange heat generated by the servers due to operations of the servers, and to remove the exchange heat to the external environment using ambient air.

Figure 1:
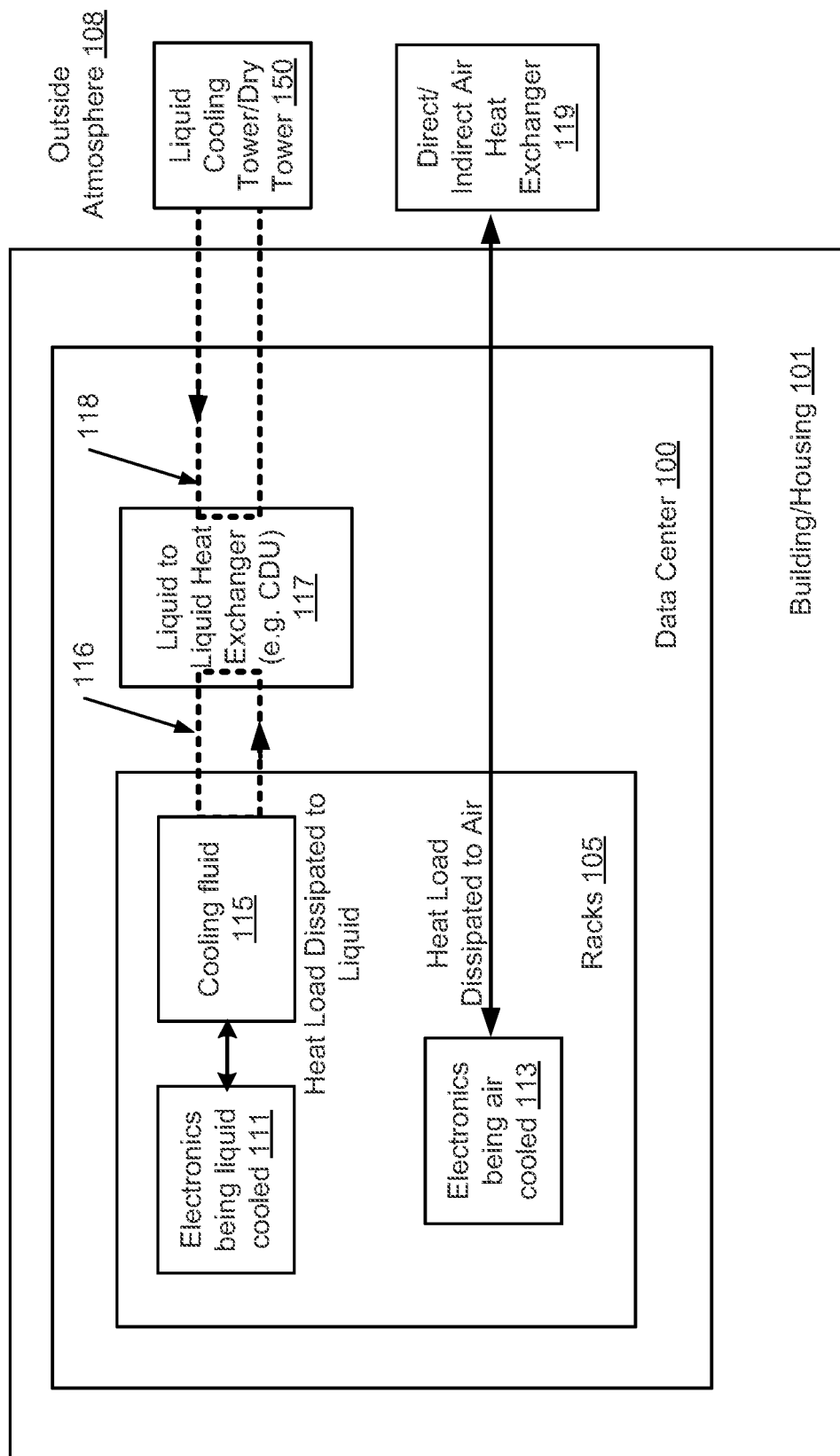
FIG. 1 is a block diagram illustrating a data center thermal management design according to one embodiment of the invention.

FIG. 1 is a block diagram illustrating a data center system according to one embodiment of the invention. In this example, FIG. 1 shows an overview of a cooling system for a data center. According to one embodiment, data center 100 is housed in building or housing 101. Data center 100 includes racks 105. Racks 105 include electronics (e.g., servers or IT components such as processors, memory, and/or storage devices) that can be grouped into electronics being liquid cooled 111 and electronics being air cooled 113 (e.g., other components on the motherboard that are not feasible or impractical to be liquid cooled). Electronics being air cooled 113 exchanges heat with or dissipates heat to a direct/indirect air heat exchanger 119 via an air flow circulation system to remove the exchanged heat to an external environment or outside atmosphere 108. For example, air heat exchanger 119 may be a direct heat exchanger such as a system of inlet and outlet fans to direct an air flow from the external environment into housing 101 to carry exchanged heat back to external environment or outside atmosphere 108.

The electronics being liquid cooled 111 exchanges heat by cooling fluid 115. In one embodiment, cooling fluid 115 is circulated within closed-loop fluid line 116. Cooling fluid 115 carries exchanged heat from server IT components of electronics being liquid cooled 111 through liquid cooling devices to a liquid to liquid heat exchanger 117 (e.g., CDU). Liquid-to-liquid heat exchanger 117 may thermally couple cooling fluid 115 to a second liquid line 118 to dissipate exchanged heat to an external cooling tower/dry tower/cooler 150.

Electronics being air cooled 113 exchanges heat by direct/indirect air heat exchanger 119. Direct air heat exchangers may include a direct free airflow from external environment into the data center building to carry a heat load back outside of the external environment 108. An indirect air heat exchanger may include a closed-loop airflow thermally coupled a second airflow to exchange heat. In one embodiment, heat generated by electronics being air cooled 113 includes heat generated from IT components of rack servers and/or heat transferred from liquid lines (both cold and hot liquid lines may transfer heat to the air, depending on the actual operating temperatures).

Figure 2:
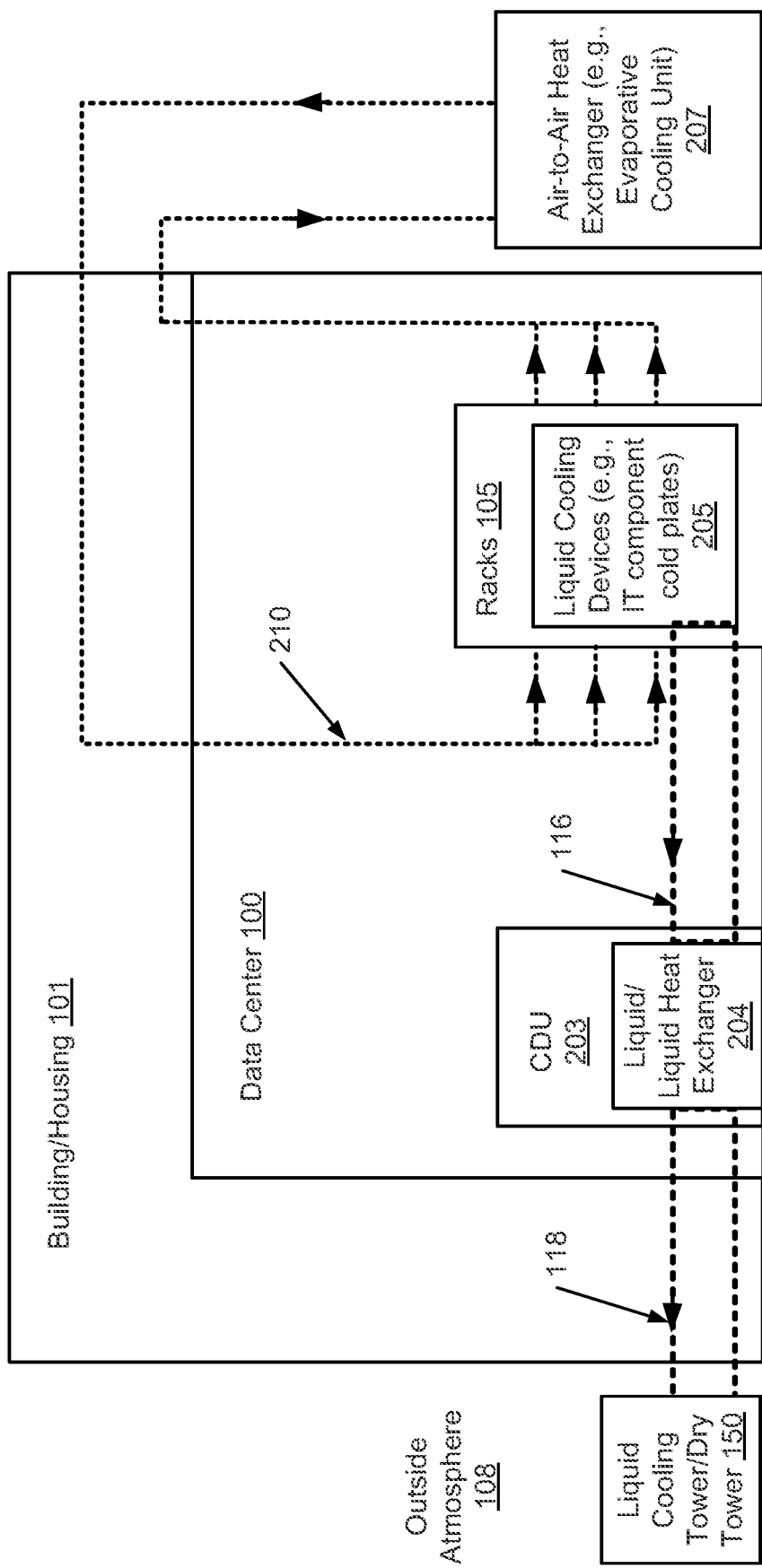
FIG. 2 is a block diagram illustrating a data center cooling system schematic representation with an indirect air cooling according to one embodiment of the invention.

FIG. 2 is a block diagram illustrating a data center cooling system with an indirect free air cooling according to one embodiment of the invention. In this example, data center 100 is housed in housing 101. Data center 100 includes a liquid cooling system. The liquid cooling system includes one or more liquid cooling devices 205 (e.g., IT component cold plates) disposed on IT components of servers of server racks 105. Liquid cooling devices 205 carry exchanged heat generated from IT components using a first liquid, to transform the first liquid into a second liquid with a higher temperature and to transmit the second liquid carrying the exchanged heat to CDU 203 to form liquid loop 116. CDU 203 includes liquid/liquid (liquid-to-liquid) heat exchanger which may represent liquid-to-liquid heat exchanger 117 of FIG. 1. CDU 203 may exchange heat to a second liquid line 118 that is connected to a liquid cooling tower/dry tower 150. Liquid cooling tower/dry tower 150 is situated external to housing 101 so exchanged heat can be dissipated to environment 108 external to housing 101. In another embodiment, liquid line 118 may be a liquid loop.

In one embodiment, CDU 203 includes a pump, a liquid reservoir, and a pump controller (not shown) coupled to heat exchanger 204 to circulate a liquid of liquid line/loop 116 and/or a liquid of liquid line/loop 118. In one embodiment, the pump controller controls a speed of the pump to control a liquid flow rate based on a sensed temperature of the IT components. In another embodiment, the pump controller may control a liquid flow rate based on a workload of the IT components. In another embodiment, CDU 203 may be placed external to the building housing 101 such that data center 100 includes only a single liquid line, such as liquid line/loop 116.

In one embodiment, data center 100 includes an airflow delivery system to generate a closed loop airflow 210, to minimize external contaminant, to cause airflow 210 to travel through servers of the electronic racks to exchange heat generated by the servers due to operations of the servers and to remove the exchanged heat to external environment 108 outside of housing 101 by air-to-air heat exchanger 207, for example, an indirect evaporative cooling unit. The air flowing within the closed-loop is isolated from the ambient air 108. The air/air (air-to-air) heat exchanger 207 is to exchange heat carried from the warm air in loop 210 with outside ambient air (e.g., cooler air). In one embodiment, air-to-air heat exchanger 207 is in a cross flow configuration such that a first airflow is perpendicular to, but separate from, a second airflow of the air-to-air heat exchanger. In another embodiment, air-to-air heat exchanger 207 is in a counter flow configuration such that a first airflow is parallel but opposite to a second airflow of the air-to-air heat exchanger. The first airflow is separated from the second airflow, for example, the first and the second airflows may be separated via an air duct system/air channels. It is assumed that the ambient temperature of outside environment 108 is lower than the designed operating temperature range within electronic racks 105. Otherwise a chiller may be needed to work with air/air heat exchanger. The location of 207 can be beside building/housing 101 or on top of building/housing 101.

Figure 3:
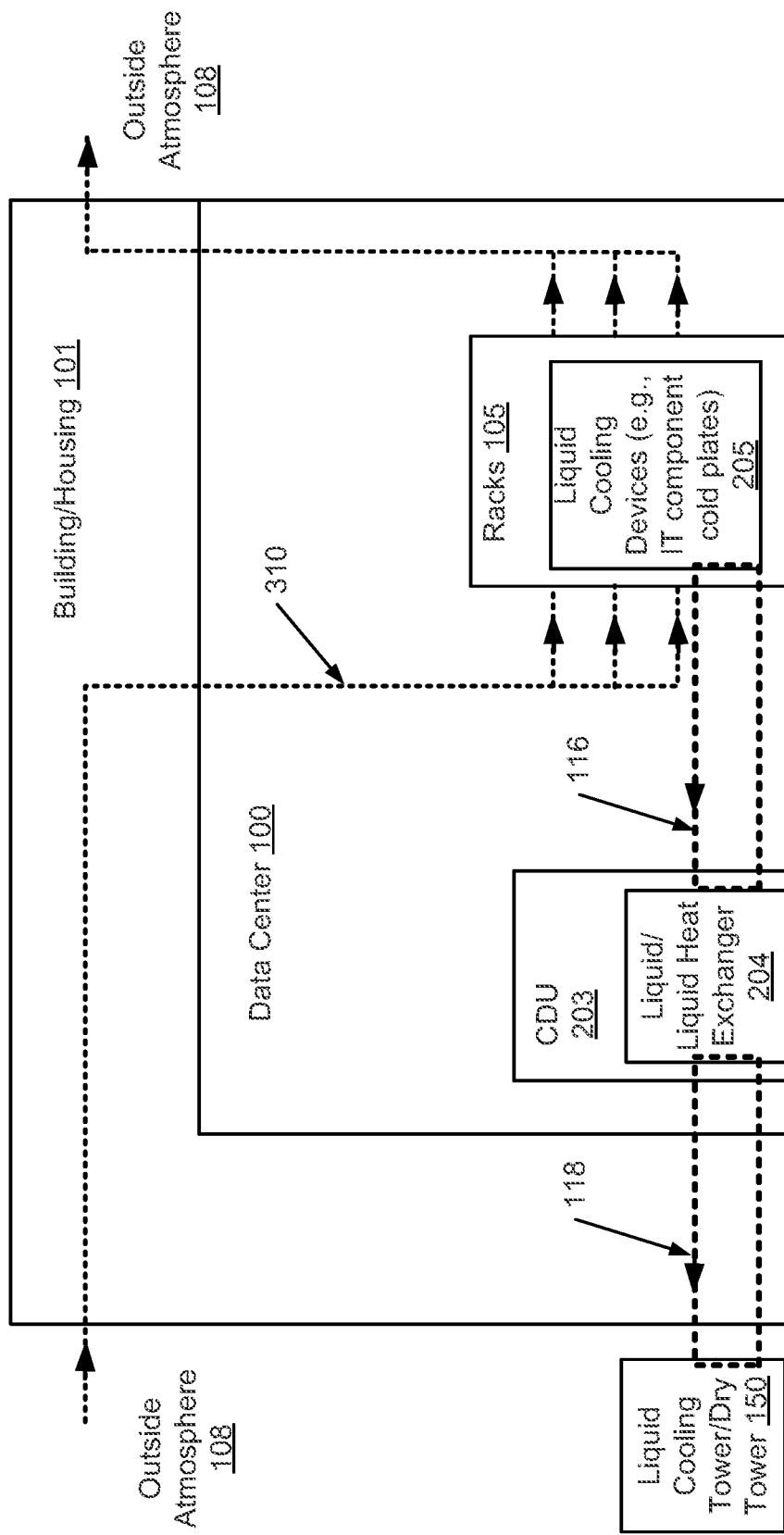
FIG. 3 is a block diagram illustrating a data center cooling system schematic representation with a direct free air cooling according to one embodiment of the invention.

FIG. 3 is a block diagram illustrating a data center cooling system with a direct free air cooling according to one embodiment of the invention. Data center 100 includes a liquid cooling system similar to the liquid cooling system of FIG. 2. In one embodiment, data center 100 includes an airflow delivery system to generate a direct airflow 310 to cause airflow 310 from outside atmosphere 108, to travel through servers of the electronic racks to exchange heat generated by the servers due to operations of the servers and to exhaust the airflow carrying the exchanged heat to outside atmosphere 108 to remove the exchanged heat to outside atmosphere 108. In this embodiment, the air circulation is configured in an open-loop configuration. The air circulation may be configured by an air duct system to draw ambient air from external environment 108. The air may be processed to reduce or remove contamination, such as filtering, moisturizing, and/or dehumidifying, to become cleaner air. The cleaner air then travels through the airspace between the IT components of servers in each of electronic racks 105 to exchange heat generated from the IT components, generating warmer air. The warmer air is then exhausted back to outside environment 108. It is assumed that the ambient temperature of outside environment 108 is lower than the ambient temperature within electronic racks 105. Otherwise, an indirect air cooling system assisted with chiller or direct expansion system may be more appropriate.

Figure 4:
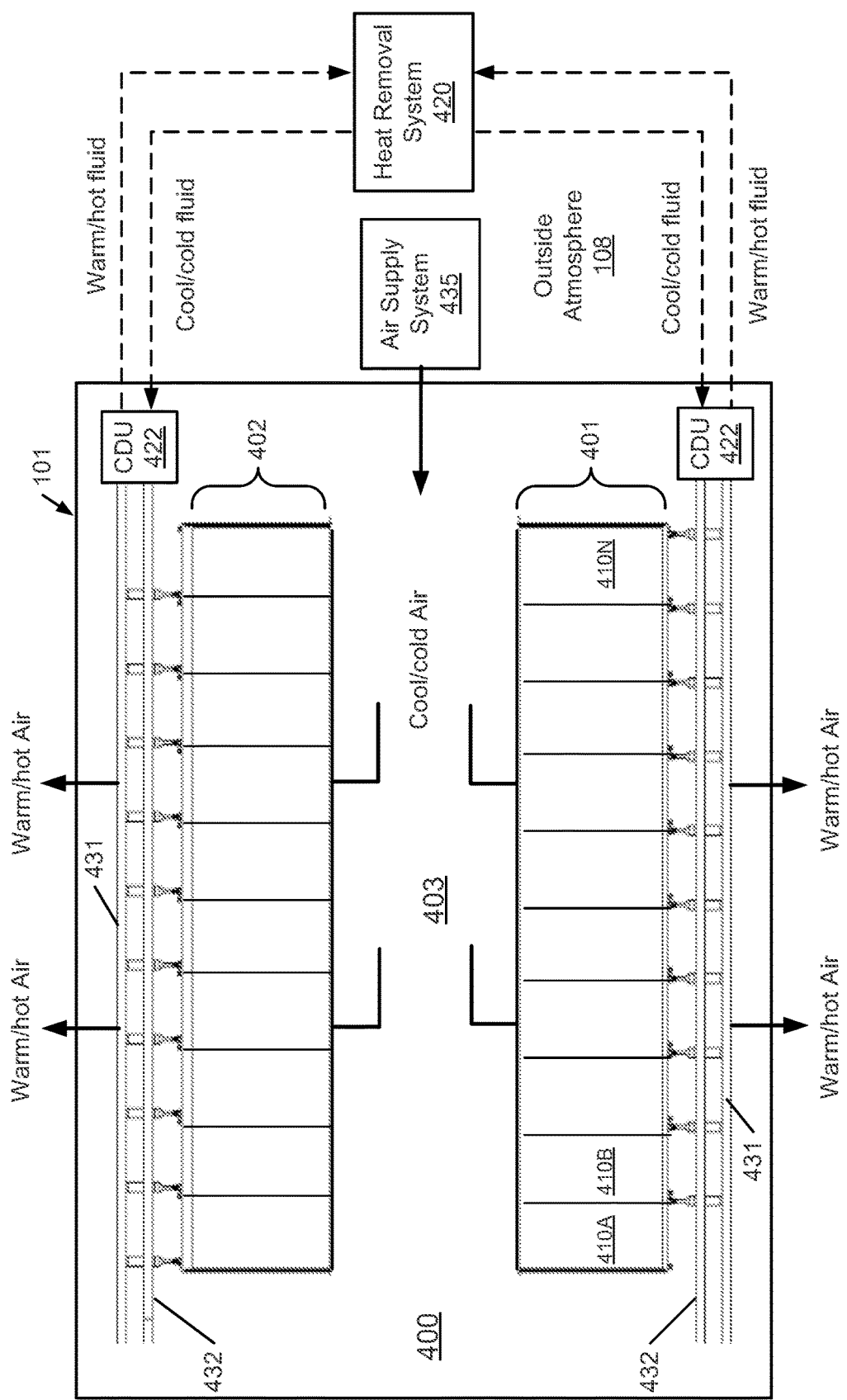
FIG. 4 is a block diagram illustrating a data center system according to another embodiment of the invention.

FIG. 4 is a block diagram illustrating a data center system according to one embodiment of the invention. In this example, FIG. 4 shows a top view of at least a portion of a data center. Referring to FIG. 4, according to one embodiment, data center system 400 includes rows of electronic racks of IT components, equipment or instruments 401-402, such as, for example, computer servers that provide data services to a variety of clients. Data center system 400 may be data center 100 of FIG. 1. In this embodiment, data center system 400 includes electronic racks arranged in row 401 and row 402 such as electronic racks 410A-410N. However, more or fewer rows of electronic racks may be implemented. Typically, rows 401-402 are aligned in parallel with frontends facing each other and backends facing away from each other, forming aisle 403 in between to allow an administrative person walking therein. However, other configurations or arrangements may also be applied.

In one embodiment, each of the electronic racks (e.g., electronic racks 410A-410N) includes a housing to house a number of electronic racks of information technology (IT) components operating therein. The electronic racks can include a heat removal liquid manifold, a number of server slots, and a number of server blades capable of being inserted into and removed from the server slots. Each server blade includes a processor, a memory, and/or a persistent storage device (e.g., hard disk), collectively referred to as IT components, which represents a computer server. The heat removal liquid manifold provides heat removal liquid from external heat removal system 420 or from one or more CDUs 422 thermally coupled to external heat removal system 420. For example, CDUs 422 may be situated within the housing to control a heat removal liquid flow rate flowing to one or more cooling devices disposed on the IT components to remove heat. The one or more cooling devices receives a first liquid from CDUs 422, to exchange heat generated from the IT components using the first liquid, to transform the first liquid into a second liquid with a higher temperature, and to transmit the second liquid carrying the exchanged heat back to CDUs 422 to form a first liquid loop. CDUs 422 are thermally coupled to heat removal system 420 via a second liquid loop or liquid line to remove the heat from the first liquid loop. In another embodiment, CDUs 422 are situated outside of housing container such that there is only one liquid line circulating a cooling liquid inside housing container. In another embodiment, the one or more cooling devices disposed on the IT components are liquid cold plates mounted on the IT components. Note that the heat removal system 420 may be coupled to multiple data center systems such as data center system 400.

In one embodiment, corresponding CDUs may be placed near each electronic rack or adjacent to one of the racks to remove heat from the server blades. In another embodiment, heat removal system 420 includes an external liquid loop connected to a cooling tower or a dry cooler external to the building/housing container. The heat removal system 420 can include but are not limited to evaporative cooling, free air, rejection to large thermal mass, and waste heat recovery designs.

In one embodiment, each server blade is coupled to the heat removal liquid manifold modularly such that a server blade can be removed from the electronic rack without affecting the operations of remaining server blades on the server rack and the heat removal liquid manifold. In another embodiment, each server blade is coupled to the heat removal liquid manifold through a quick-release coupling assembly having a first liquid intake connector and a first liquid outlet connector coupled to a flexible hose to distribute the heat removal liquid to the IT component. The first liquid intake connector is to receive heat removal liquid via a second liquid intake connector from a heat removal liquid manifold mounted on a backend of the electronic rack. The first liquid outlet liquid connector is to emit warmer or hotter liquid carrying the heat exchanged from the IT component to the heat removal liquid manifold via a second liquid outlet connector and then back to a CDU within the electronic rack or CDUs 422. In one embodiment, the first liquid intake connector and the first liquid outlet connector are capable of extending outwardly external to the server tray to connect to, and disconnect from, respectively, a second liquid intake connector and a second liquid outlet connector fixedly disposed on the heat removal liquid manifold assembly within the electronic rack. In another embodiment, the flexible hose is a corrugated hose.

In one embodiment, the heat removal liquid manifold disposed on the backend of each electronic rack is coupled to liquid supply line 432 to receive heat removal liquid from heat removal system 420. The heat removal liquid is to remove heat from the IT component. The resulting warmer or hotter liquid carrying the heat exchanged from the IT component is transmitted via supply line 431 back to heat removal system 420. Liquid supply lines 431-432 are referred to as data center liquid supply lines (e.g., global liquid supply lines), which supply heat removal liquid to all of the electronic racks of rows 401-402. According to one embodiment, a primary loop of the heat exchanger is coupled to liquid supply line 432 and liquid return line 431. A secondary loop of the heat exchanger is coupled to the liquid manifold of the electronic rack. The liquid manifold includes an array of pairs of liquid intake connectors and liquid outlet connectors coupled to a liquid supply manifold and a liquid return manifold, respectively. As one embodiment, each pair of the liquid intake connector and liquid outlet connector of the liquid manifold is coupled to a corresponding pair of a liquid intake connector and a liquid outlet connector of one of the server blades.

In one embodiment, data center system 400 includes an airflow delivery system, such as air supply system 435, to generate an airflow to cause the airflow to travel through the servers of the electronic racks to exchange heat generated by the server due to operations of the servers and to exhaust the airflow exchanged heat to an external environment 108 outside of housing/room/building 101. For example, air supply system 435 generates an airflow of cool/cold air to circulate from aisle 403 through server racks 410A-410N to carry away exchanged heat. The warm/hot air with exchanged heat is exhausted from room/building 101. In another embodiment, air supply system 435 forms a closed-loop airflow to cause the air flow to travel through the servers of the electronic racks to exchange heat generated by the servers due to operations of the servers, and to remove the exchanged heat to the external environment outside of the housing by an air-to-air heat exchanger (not shown), without removing housing/building air. Note that air supply system 435 may be coupled to multiple data center systems such as data center system 400.

Figure 5A:
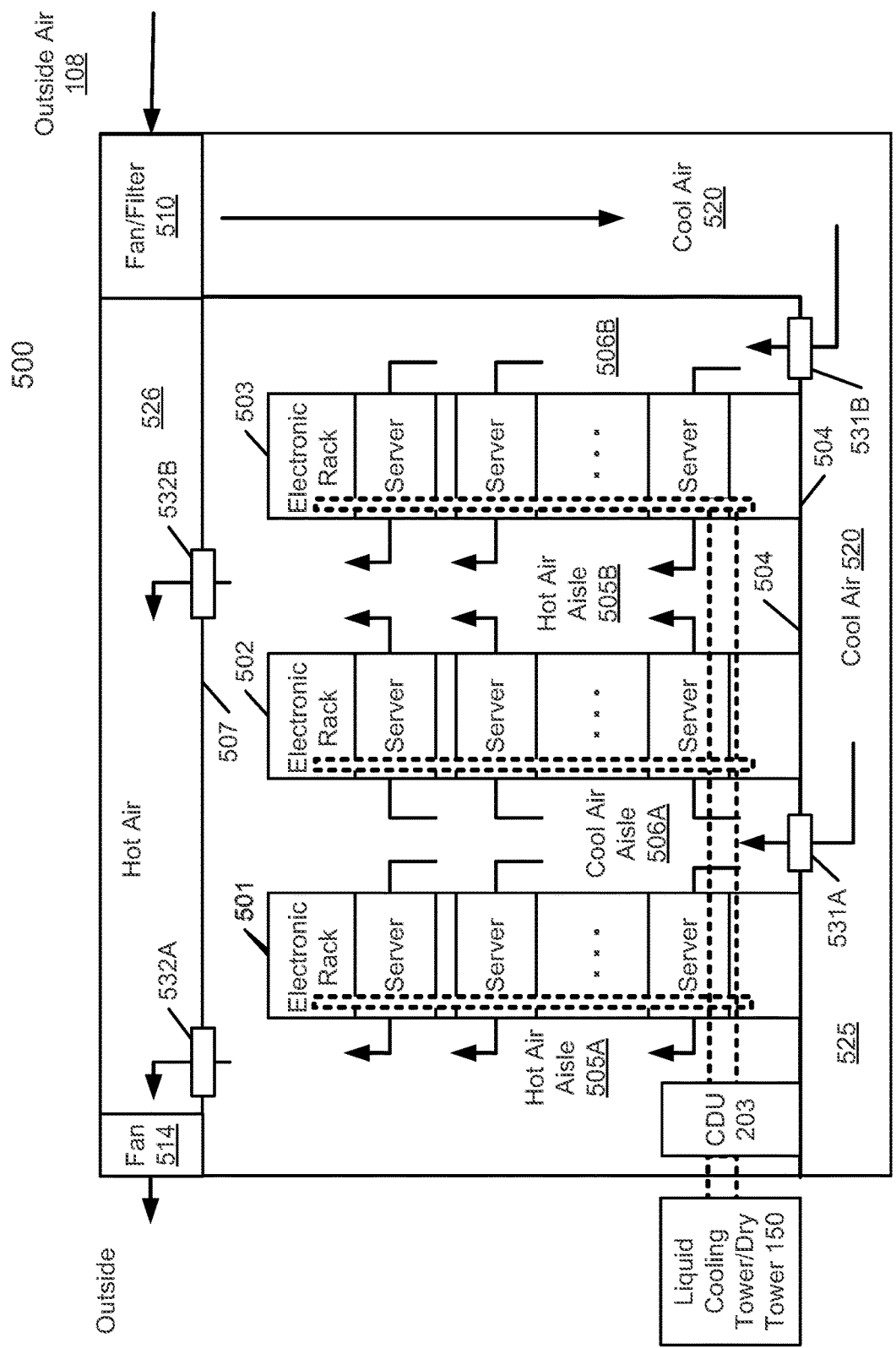
FIGS. 5A and 5B are block diagrams illustrating a data center system with a direct free air cooling according to another embodiment of the invention.
Figure 5B:
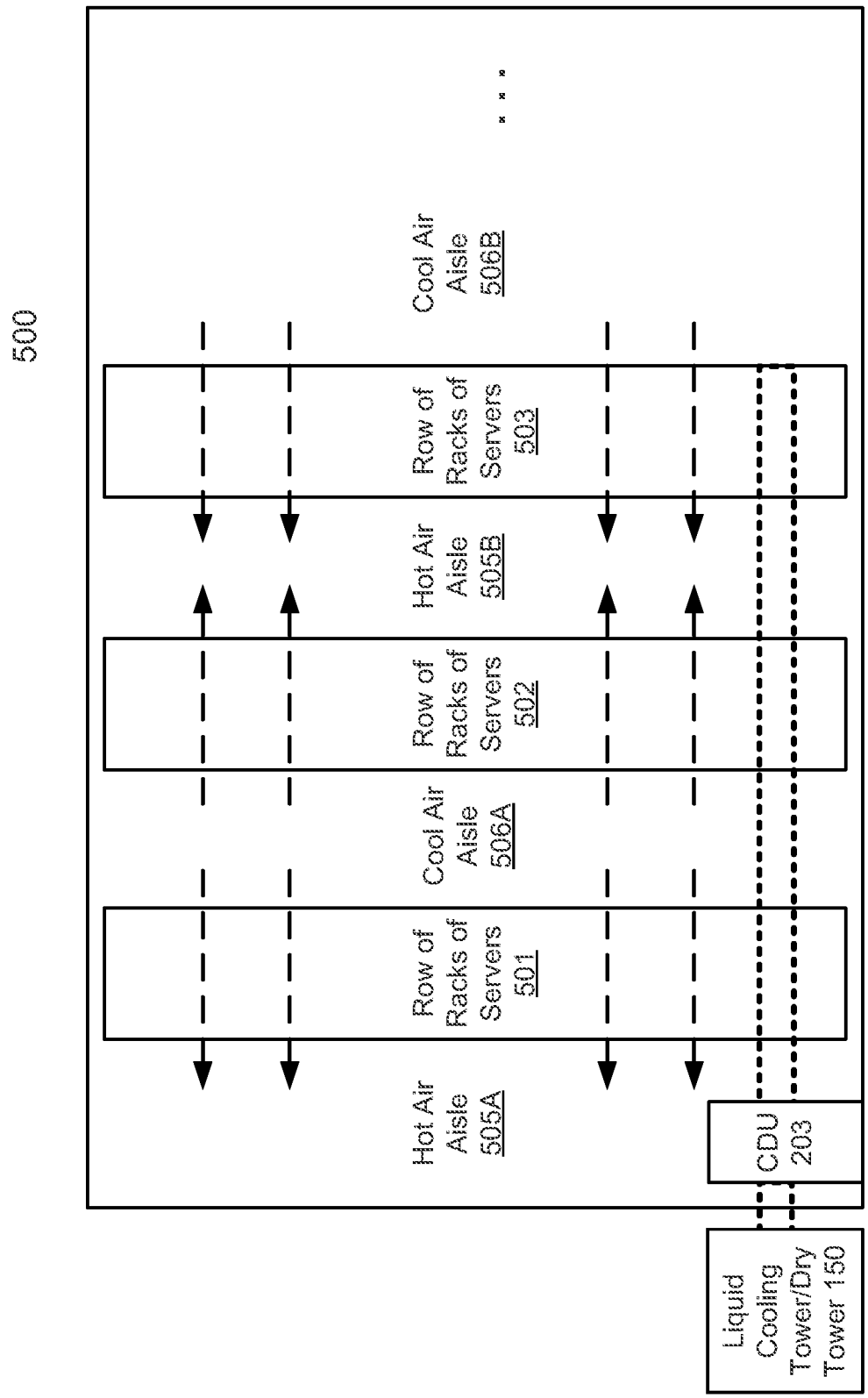

FIGS. 5A and 5B are block diagrams illustrating a data center system with a direct free air cooling according to another embodiment of the invention. In this example, a cross-section view or side view of a data center system is shown in FIG. 5A while a top view of the data center system is shown in FIG. 5B. Referring to FIG. 5A, data center system 500 includes a housing structure, such as a room or a container, to house rows of racks of IT equipment or instruments 501-503, in this example, computer servers that provide data services. Although only three rows of racks 501-503 are shown, more or fewer rows may be applied. The rows of electronic racks 501-503 are arranged in such a way to form aisles between every two rows, including hot air aisles 505A-505B and cool air aisles 506A-506B in this example. Electronic racks 501-503 may be electronic racks 410A-410N of FIG. 4.

In one embodiment, data center system 500 includes CDU 203 situated within the housing to control a liquid flow of a cooling liquid. CDU 203 distributes cooling liquid to one or more cooling devices disposed on IT components of electronic racks 501-503 to remove heat generated from the IT components. CDU 203 is coupled to a heat exchange unit, such that exchanged heat is removed to a liquid cooling tower/dry tower 150.

In one embodiment, data center system 500 further includes fan/filter unit 510 (also referred to as an air supply system for the data center system) (510 may also include humidification or dehumidification unit which is not shown in the figure). Air supply system 510 is configured to take in or draw fresh, possibly polluted, and non-conditioned air, also referred to as outside air 108, from an external environment into the housing of the data center system. Air supply system 510 may include one or more intake fans to draw in outside air 108 and one or more air filters, moisturizers, and/or dehumidifiers to filter, moisturize, and/or dehumidify outside air 108, generating filtered air. The filters may reduce a portion of the particles or pollutants in the outside air 108.

According to one embodiment, data center system 500 further includes an airflow delivery system configured to generate one or more airflows based on cool and air 520 to deliver the airflows of cool air 520 to cool the rows of electronic racks 501-503. In this example, the airflow delivery system includes a first channel or tunnel or airspace 525 to deliver cool air 520 into the housing that houses the rows of electronic racks 501-503. In one embodiment, first channel 525 may include one or more air ducts disposed underneath the floor or surface 504 (e.g., raised floor) that supports the rows of electronic racks 501-503. Multiple inlet ports (e.g., perforated tiles) 531A-531B may be disposed on various locations of floor 504 to allow the airflow of the cool air 520 to flow into the housing. In one embodiment, cool air 520 may directly be supplied to the raised floor.

In one embodiment, the inlet ports 531A-531B are arranged and disposed within proximity or at the bottom of cool air aisles 506A-506B of floor 504. Optionally, a fan or fans may be mounted on at least some of the inlet ports 531A-531B to draw or take in the cool air 520 from channel 525 upwardly into cool air aisles 506A-506B. For example, cool air is drawn from cool aisle 506A to hot air aisle 505A, traveling through the servers of row 501. Due to the heat exchange, the airflow flowing into hot air aisle 505A has a temperature higher than the temperature of the airflow received in cool air aisle 506A. As a result of liquid cooling and hot/cold air aisle airflow designs, the servers may operate without server fans.

According to one embodiment, ceiling 507 of the housing includes one or more outlet ports (opening or windows) 532A-532B disposed within a proximity or on top of hot air aisles 505A-505B to allow the hot or warm air to be exhausted upwardly into second channel or tunnel or airspace 526, which will be directed to the external environment via fan 514. A fan may be optionally disposed or mounted on at least some of outlets 532A-532B to exhaust the hot or warm air from hot air aisles 505A-505B into tunnel 526. The cool air aisles 506A-506B and hot air aisles 505A-505B are configured in an alternate manner with respect to rows of electronic racks 501-503. In one embodiment, rows of electronic racks 501-503 are arranged in a specific configuration in which each row is sandwiched between a cool air aisle and a hot air aisle. The rows of electronic racks 501-503 are arranged in such a way that most of the cool air 520 will flow through the servers of the electronic racks 501-503 from cool air aisles 506A-506B to hot air aisles 505A-505B respectively. In this embodiment, cooler air is drawn from one side of the data center system 500 and warmer air is exhausted back to the outside environment from other side of the data center system 500.

Note that the configuration of data center system 500 as shown in FIG. 5A-5B are illustrated and described for the purpose of illustration only. Other configurations or layouts of the components may also be applied. Air supply system 510 may be located in a variety of locations with respect to the housing of data center system 500. For example, air supply system 510 may be located external to the housing (e.g., on the floor or from a remote or distant location) and the cool air 520 may be delivered through a pipe/air duct coupled to channel 525. Air supply system 510 may be located from a side wall of data center 100. Other configurations may exist. Also note that the configuration of FIG.

5A can be easily converted into an indirect air cooling system by circulating the air within a closed-loop. That is, the air exhausted from fan 514 is fed back via a closed channel to an air/air exchanger, and circulated back into data center system via fan/filter or air supply system 510.

Figure 6:
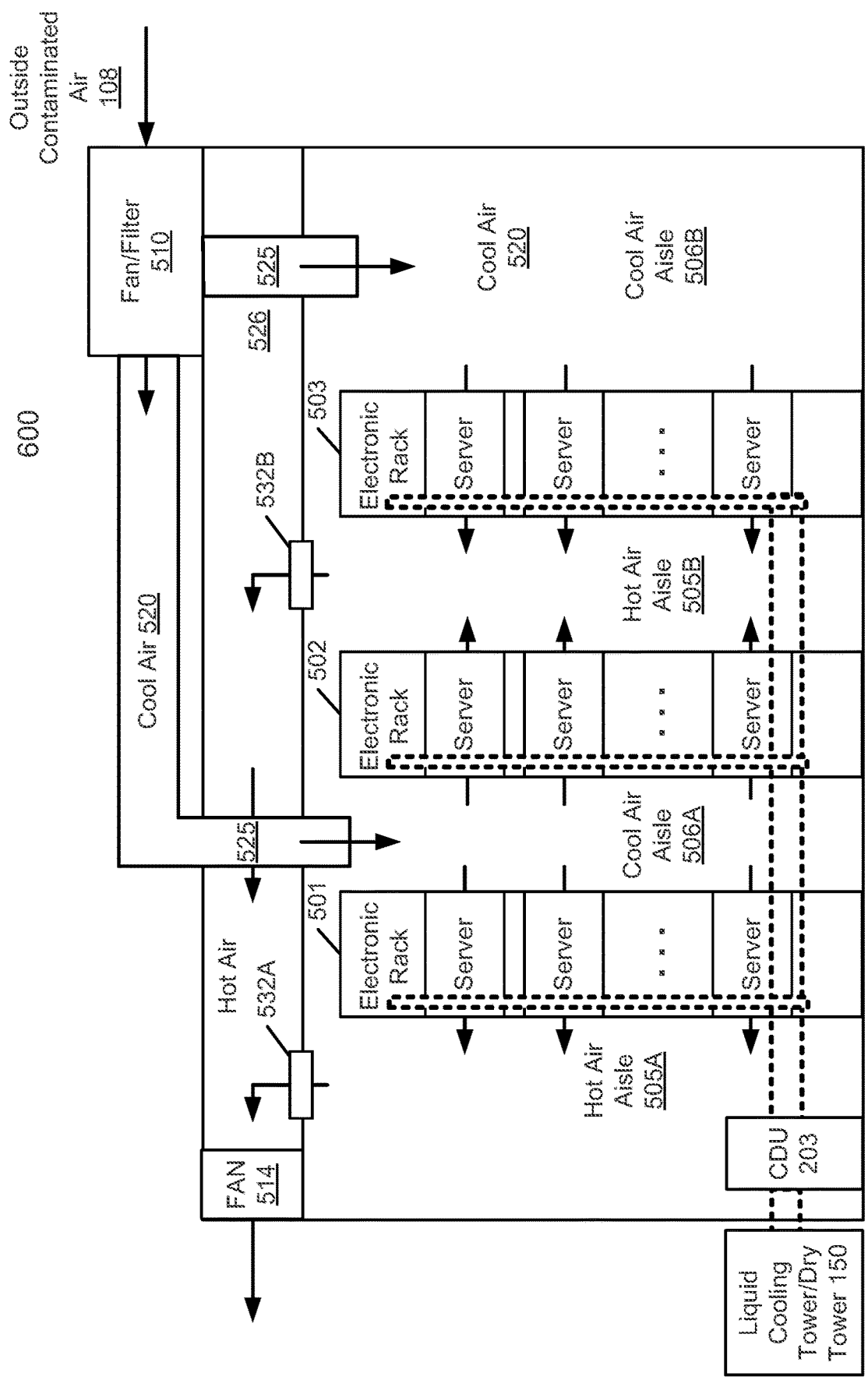
FIG. 6 is a block diagram illustrating a data center system with a direct free air cooling according to another embodiment of the invention.

FIG. 6 is a block diagram illustrating a data center system with a direct free air cooling according to another embodiment of the invention. Referring to FIG. 6, in this example, data center includes a liquid cooling system similar to liquid cooling system of FIG. 5A. The data center 600 includes an air delivery system includes a first channel or tunnel or airspace 525 above a ceiling of the container/housing to deliver cool air 520 into the housing that houses the rows of electronic racks 501-503. Electronic racks 501-503 may be electronic racks 410A-410N of FIG. 4. The first channel 525 may include one or more pipes or tubes forming air ducts disposed above the ceiling of the container/housing. Multiple inlet ports may be disposed on various locations of the ceiling to allow the airflow of the cool air 520 to flow into the housing.

In one embodiment, the ceiling of the housing includes one or more outlet ports (opening or windows) disposed within proximity or on top of hot air aisles 505A-505B to allow the hot or warm air to be exhausted upwardly into second channel or tunnel or airspace 526, which will be directed to the external environment via fan 514. The first and second airspaces are separate airspaces, for example, the first and second airspaces may be separated by an air duct. A fan may be optionally disposed or mounted on at least some of outlets 532A-532B to exhaust the hot or warm air from hot air aisles 505A-505B into tunnel 526. The cool air aisles 506A-506B and hot air aisles 505A-505B are configured in an alternate manner with respect to rows of electronic racks 501-503. In one embodiment, rows of electronic racks 501-503 are arranged in a specific configuration in which each row is sandwiched between a cool air aisle and a hot air aisle. The rows of electronic racks 501-503 are arranged in such a way that most of the cool air 520 will flow through the servers of the electronic racks 501-503 from cool air aisles 506A-506B to hot air aisles 505A-505B respectively. Also note that the configuration of FIG. 6 can be easily converted into an indirect air cooling system by circulating the air within a closed-loop. That is, the air exhausted from fan 514 is fed back via a closed channel to an air/air exchanger, and circulated back into data center system via fan/filter or air supply system 510.

Figure 7:
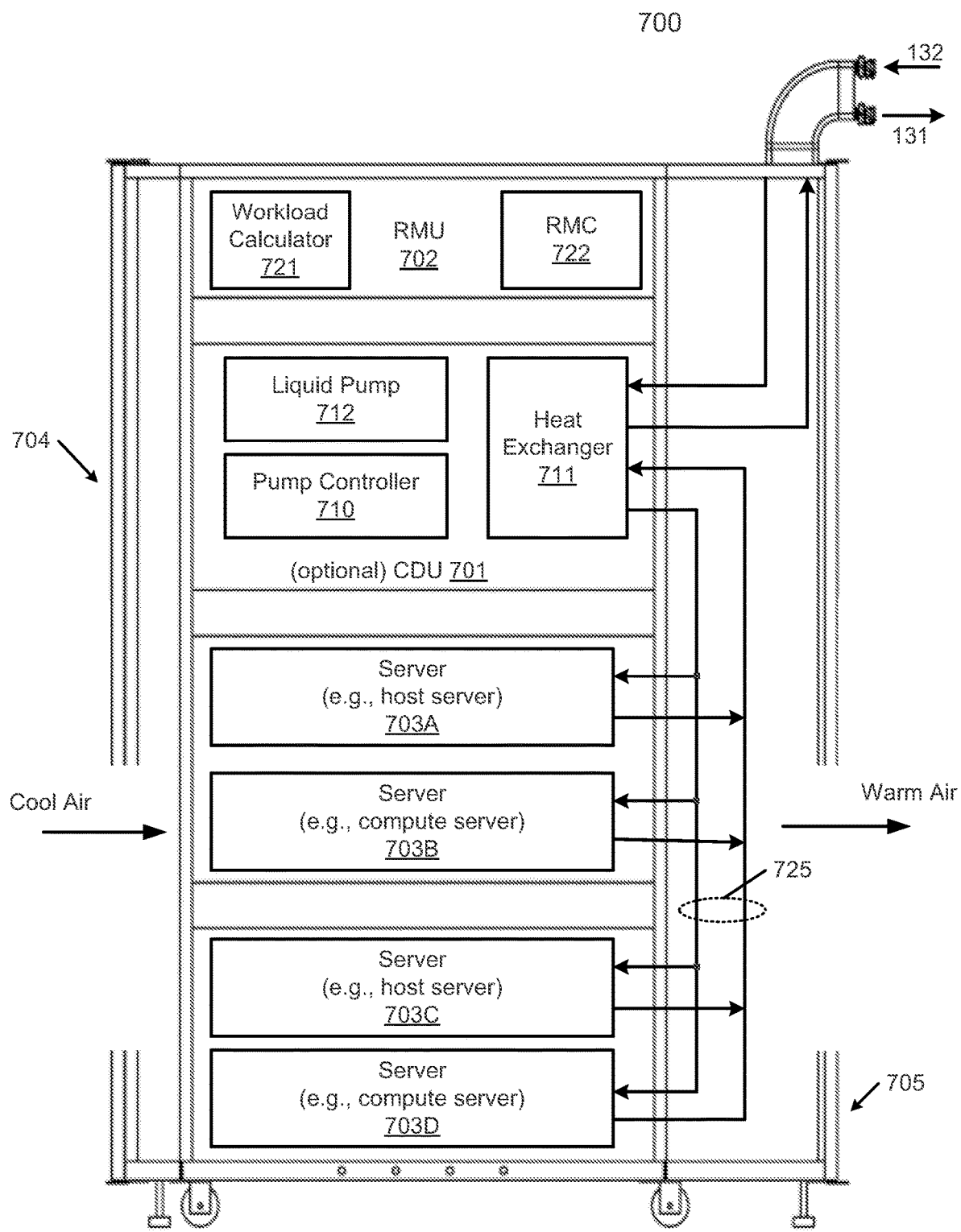
FIG. 7 is a block diagram illustrating an example of an electronic rack according to one embodiment of the invention.

FIG. 7 is a block diagram illustrating a side view of an electronic rack according to one embodiment of the invention. Electronic rack 700 may represent any of the electronic racks of rows 410A-410N of FIG. 4. Referring to FIG. 7, in one embodiment, electronic rack 700 includes CDU 701 (optional), rack management unit (RMU) 702, and one or more server blades 703A-703D, collectively referred to as server blades 703. Sever blades 703 can be inserted into an array of server slots respectively from frontend 704 of electronic rack 700. Note that although there are only four server blades 703A-703D shown in FIG. 7, more or fewer server blades may be maintained within electronic rack 700. Also note that the particular positions of CDU 701 (optional), RMU 702, and server blades 703 are shown for the purpose of illustration only; other arrangements or configurations of CDU 701 (optional), RMU 702, and server blades 703 may also be implemented. Other IT equipment such as switch as a network device may also be implemented.

In one embodiment, CDU 701 includes heat exchanger 711, liquid pump 712, liquid reservoir (not shown), and pump controller 710. Heat exchanger 711 may be a liquid-to-liquid heat exchanger. Heat exchanger 711 includes a first tube having a first pair of liquid connectors coupled to external liquid supply lines 131-132 to form a primary loop, where the connectors coupled to the external liquid supply lines 131-132 may be disposed or mounted on backend 705 of electronic rack 700. In addition, heat exchanger 711 further includes a second tube having a second pair of liquid connectors coupled to liquid manifold 725, which may include a supply manifold to supply cooling liquid to server blades 703 and a return manifold to return warmer liquid back to CDU 701.

Each of server blades 703 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. Server blades 703 may include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which may generate heat during the operations.

Electronic rack 700 further includes RMU 702 configured to provide and manage power supplied to servers 703A-703D and CDU 701. RMU 702 may be coupled to a power supply unit (not shown) to manage the power consumption of the power supply unit, as well as other thermal management of the power supply unit (e.g., cooling fans). The power supply unit may include the necessary circuitry (e.g., an alternating current (AC) to direct current (DC) or DC to DC power converter, battery, transformer, or regulator, etc.) to provide power to the rest of the components of electronic rack 700.

In one embodiment, RMU 702 includes workload calculator or calculation module 721 and rack management controller (RMC) 722. Workload calculator 721 is coupled to at least some of server blades 703 to receive workload information representing the workload of the server blades and to calculate the total workload of the server blades. Based on the total workload, RMC 722 is configured to send a signal or data to pump controller 710 of CDU 701, where the signal or data indicates the required workload of the server blades 703. Based on the workload of server blades 703, pump controller 710 controls the speed of liquid pump 712, which in turn controls the liquid flow rate of heat removal liquid supplied to the liquid manifold to be distributed to at least some of server blades 703.

Specifically, according to one embodiment, workload calculator 721 is coupled to each of the host servers to receive workload information from the host servers that distribute the tasks to one or more compute servers. The workload information may include information indicating the power (e.g., wattages) the compute servers will likely consume while performing the tasks. In one embodiment, the host servers communicate the workload information to workload calculator 721 prior to distributing the tasks to compute servers, such that the liquid flow rate is adjusted prior to the temperatures of the compute servers rise.

In addition, according to another embodiment, RMC 722 is also coupled to at least the compute servers to periodically or constantly monitor the operating temperatures of the compute servers and to dynamically further adjust the liquid flow rate of the heat removal liquid based on the operating temperatures. Each of the compute servers may include a thermal sensor to sense the operating temperature of one or more processors of the compute server. The thermal sensor may be directly attached to a body of the processor or a heat sink attached to the processor. Thus, the temperature measured directly represents the temperature of the processor instead of the ambient temperature of the operating environment surrounding the server. The liquid flow rate of the heat removal liquid is adjusted based on the temperature of the processors, instead of the ambient temperature or the temperature of the return liquid.

In one embodiment, electronic rack 700 includes a first opening or inlet for cool air to flow in, and a second opening or outlet for warm/hot air to flow out of electronic rack 700. The first and second openings may be situated on the front, back of the electronic rack respectively. In another embodiment, the first and second openings may be situated on sides, top, or bottom of the electronic rack.

In one embodiment, the liquid cooling system is configured to remove most of the heat generated by higher power consumption components of the server (e.g., CPUs, GPUs), while the air cooling system is configured to remove heat generated by lower power consumption components that are impractical or not feasibly removed by the liquid cooling system, such as, for example, memory, storage devices, motherboard, as well as the heat radiated from the higher power consumption components. By combining a liquid cooling system and an air cooling system, the individual fans normally mounted on the server blades or the electronic racks may not be needed. However, power supply units and/or network equipment of an electronic rack may still need to be fan cooled if necessary.

Note that the cooling techniques described above can be applied to a variety of different types of data centers, such as, for example, traditional colocation data centers and greenfield data centers. A colocation data center is a type of data center where equipment, space, and bandwidth are available for rental to retail customers. Colocation facilities provide space, power, cooling, and physical security for the server, storage, and networking equipment of other firms, and connect them to a variety of telecommunications and network service providers with a minimum of cost and complexity. A greenfield data center refers to a data center that is built and configured in a location where none exists before. The techniques described above can also be applied to or work in conjunction with a performance optimized data center (POD), or portable on-demand or container data center, where racks of servers are housed in one or more individual containers, modular rooms, or modular housings.

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A data center system, comprising:
a housing to house a plurality of electronic racks of information technology (IT) components operating therein, each of the electronic racks including:
a heat removal liquid manifold assembly to provide heat removal liquid, the heat removal liquid manifold coupled to a coolant distribution unit (CDU) situated within the housing to control a liquid flow of a cooling liquid, wherein the heat removal liquid manifold is mounted on a backend of the respective electronic rack and the CDU is shared between the plurality of electronics racks;
a plurality of server blades contained in a plurality of server slots respectively, each server blade including one of the IT components representing a server therein, wherein each server blade is coupled to the heat removal liquid manifold modularly, such that a server blade can be removed from the electronic rack without affecting the operations of remaining server blades, to receive cooler liquid from the heat removal liquid manifold to remove heat generated by the IT component and to transmit warmer liquid carrying the heat exchanged from the IT component back to the heat removal liquid manifold;
one or more cooling devices disposed on the IT components to receive a first liquid from the CDU, to exchange heat generated from the IT components using the first liquid, to transform the first liquid into a second liquid with a higher temperature, and to transmit the second liquid carrying the exchanged heat back to the CDU to form a first liquid loop, wherein the one or more CDUs couples the first liquid loop to a heat dissipating system to carry the exchanged heat to the external environment outside of the housing without a chiller unit; and
an airflow delivery system to generate an airflow from a cooler/colder external environment, to cause the airflow to travel through the servers of the electronic racks to exchange heat generated by the servers due to operations of the servers, and to exhaust the airflow carrying the exchanged heat back to the external environment outside of the housing.

2. The data center system of claim 1, wherein the airflow delivery system comprises an air filtration system to receive cool air from an external environment of the housing and to deliver the cool air to flow within an airspace between the IT components, generating warm air.

3. The data center system of claim 2, wherein the airflow delivery system comprises an air exhaust fan to remove the warm air within the housing to an external environment of the housing, such that server fans and rack fans are eliminated, wherein the exhaust air has a higher temperature than the external environment.

4. The data center system of claim 3, wherein the air filtration system is situated on a first side of the housing to receive cool air from the first side of the housing, wherein the air exhaust fan is situated on a second side of the housing to cause the airflow to travel from the first side through the IT components of the electronic racks to the second side of the housing.

5. The data center system of claim 1, wherein the CDU comprises:
   a heat exchanger to exchange heat carried by the warmer liquid with an external cooler liquid supplied by an external heat removal system;
   a liquid pump to pump the cooler liquid into the heat removal liquid manifold;
   a pump controller coupled to the liquid pump; and
   a liquid reservoir coupled to the liquid pump.

6. The data center system of claim 5, wherein the pump controller controls liquid flow rate based on a temperature of the IT components.

7. The data center system of claim 5, wherein the pump controller controls liquid flow rate based on a workload of the IT components.

8. The data center system of claim 1, wherein the one or more cooling devices are one or more liquid cold plates mounted on the IT components.

* * * * *